(12) United States Patent
Yamada

(10) Patent No.: US 10,903,193 B2
(45) Date of Patent: Jan. 26, 2021

(54) LIGHT-EMITTING DEVICE

(71) Applicant: NICHIA CORPORATION, Anan (JP)

(72) Inventor: Motokazu Yamada, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/457,412

(22) Filed: Jun. 28, 2019

(65) Prior Publication Data

US 2020/0006297 A1 Jan. 2, 2020

(30) Foreign Application Priority Data

Jun. 29, 2018 (JP) ................................ 2018-124179

(51) Int. Cl.
| | |
|---|---|
| *H01L 25/075* | (2006.01) |
| *H01L 33/50* | (2010.01) |
| *H01L 33/54* | (2010.01) |
| *H01L 33/56* | (2010.01) |
| *H01L 33/58* | (2010.01) |
| *H01L 33/60* | (2010.01) |

(Continued)

(52) U.S. Cl.
CPC .......... *H01L 25/0753* (2013.01); *F21V 7/05* (2013.01); *F21V 7/22* (2013.01); *H01L 33/502* (2013.01); *H01L 33/54* (2013.01); *H01L 33/56* (2013.01); *H01L 33/58* (2013.01); *H01L 33/60* (2013.01); *H01L 33/62* (2013.01); *F21Y 2105/16* (2016.08); *F21Y 2115/10* (2016.08)

(58) Field of Classification Search
CPC ... H01L 25/0753; H01L 33/502; H01L 33/54; H01L 33/56; H01L 33/58; H01L 33/62; H01L 33/60; F21V 7/05; F21V 7/22; F21V 7/0083; F21V 7/04; F21Y 2115/10; F21Y 2105/16; G02F 1/133605
USPC .......................................................... 257/88
See application file for complete search history.

(56) References Cited

U.S. PATENT DOCUMENTS

2013/0051017 A1  2/2013  Heim et al.
2013/0100648 A1  4/2013  Nozawa
(Continued)

FOREIGN PATENT DOCUMENTS

EP    2 863 113 A1    4/2015
JP    2011-181219 A   9/2011
(Continued)

*Primary Examiner* — Caleen O Sullivan
(74) *Attorney, Agent, or Firm* — Birch, Stewart, Kolasch & Birch, LLP

(57) ABSTRACT

A light-emitting device includes a base member, conductor wiring on an upper surface of the base member, a reflective member covering the upper surfaces of the base member and the conductor wiring and having apertures to expose part of the upper surface of the base member and part of the upper surface of the conductor wiring, a plurality of light sources bonded to the part of the upper surface of the conductor wiring located in the apertures with bonding members, and a reflector that is disposed on the reflective member and includes a plurality of first surrounding portions and a plurality of second surrounding portions surrounding the first surrounding portions, which respectively surround the light sources in a plan view. Each surrounding portion has inclined lateral surfaces that widen in an upward direction. An aperture in each second surrounding portion is smaller than an aperture in each first surrounding portion in the plan view.

20 Claims, 10 Drawing Sheets

(51) Int. Cl.
   *H01L 33/62*   (2010.01)
   *F21V 7/05*    (2006.01)
   *F21V 7/22*    (2018.01)
   *F21Y 115/10*  (2016.01)
   *F21Y 105/16*  (2016.01)

(56) References Cited

U.S. PATENT DOCUMENTS

| | | | |
|---|---|---|---|
| 2018/0023784 A1* | 1/2018 | Tamura | G02F 1/133602 |
| | | | 362/235 |
| 2018/0080625 A1 | 3/2018 | Yamada et al. | |
| 2018/0180249 A1* | 6/2018 | Yamada | H01L 33/505 |
| 2019/0063723 A1* | 2/2019 | Yamada | H01L 33/0075 |

FOREIGN PATENT DOCUMENTS

| | | |
|---|---|---|
| JP | 2013-247038 A | 12/2013 |
| JP | 2017-92021 A | 5/2017 |
| JP | 2018-45972 A | 3/2018 |
| WO | WO 2012/005061 A1 | 1/2012 |
| WO | WO 2012/023459 A1 | 2/2012 |

* cited by examiner

[FIG. 1A]
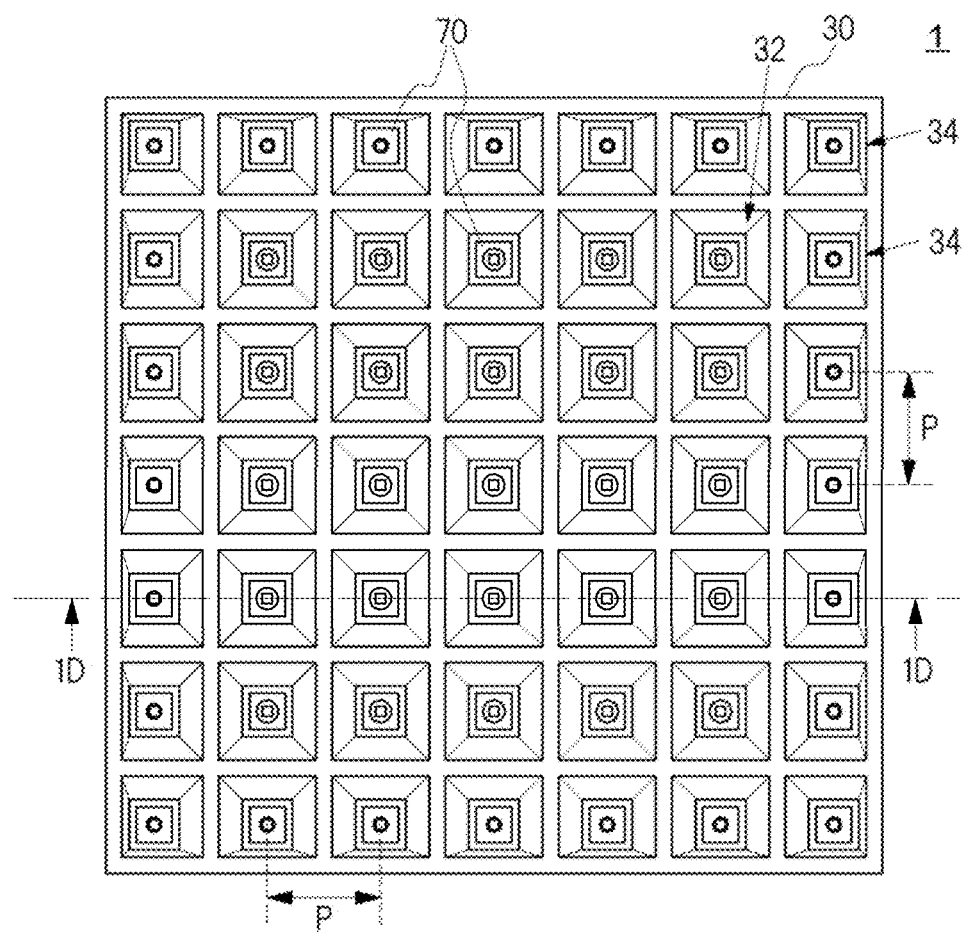

[FIG. 1B]
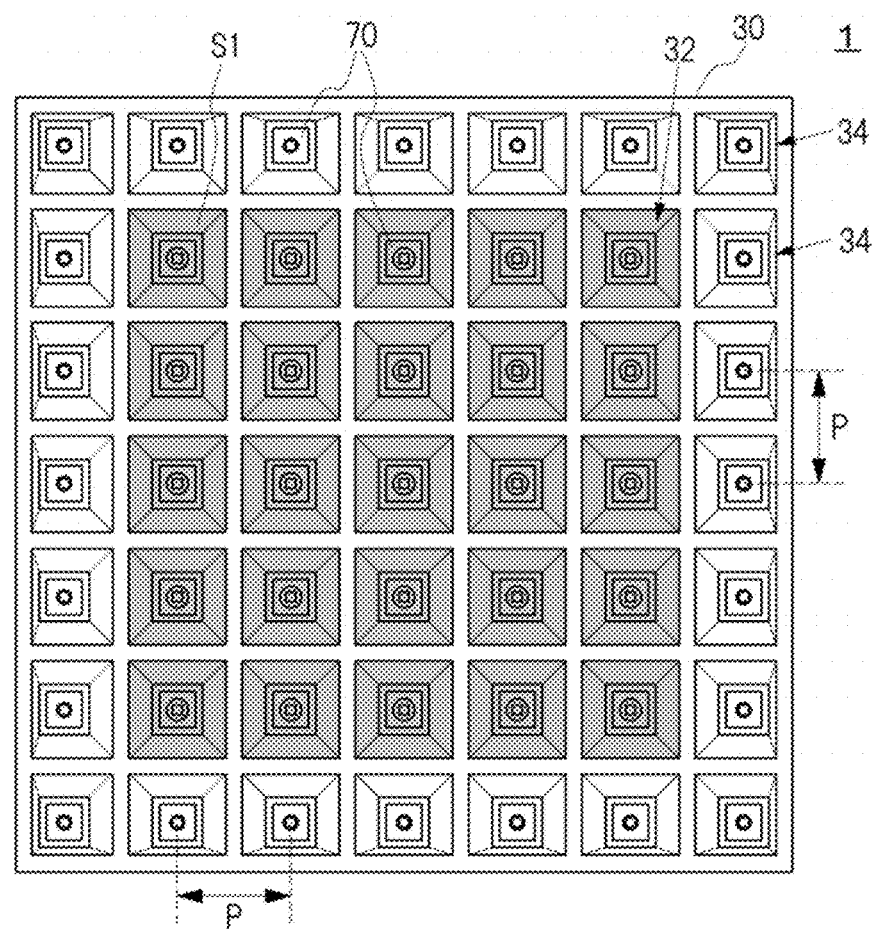

[FIG. 1C]
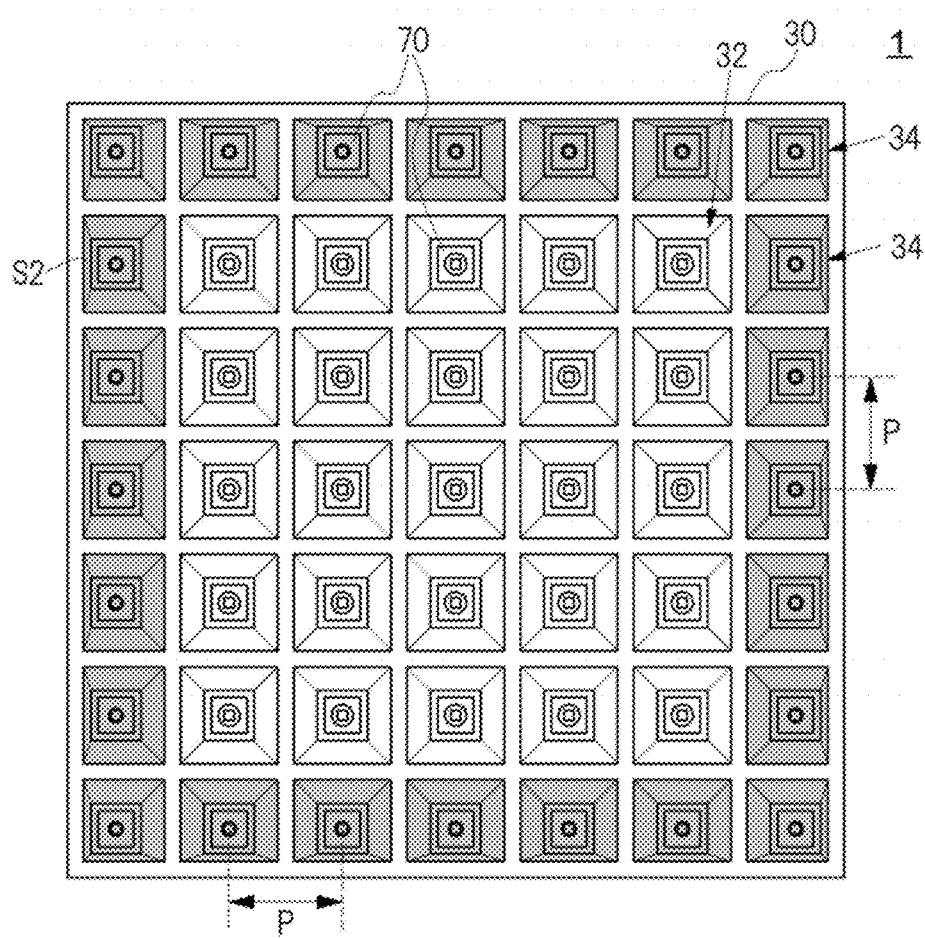
[FIG. 1D]
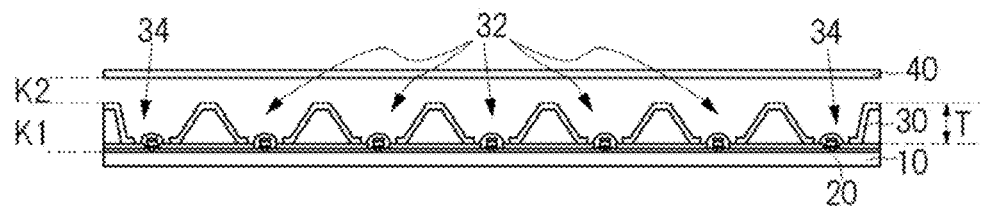

[FIG. 1E]
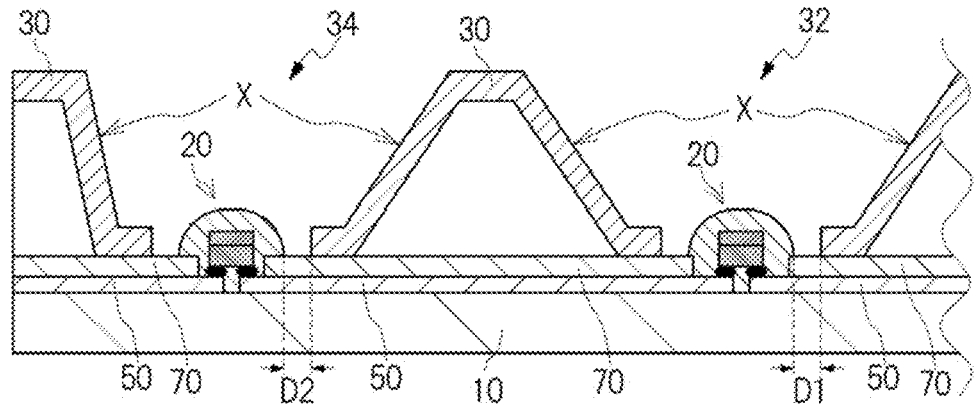
[FIG. 1F]
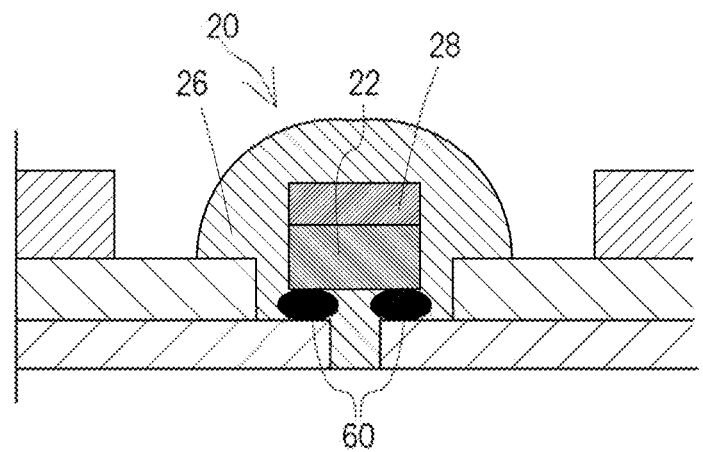
[FIG. 2A]
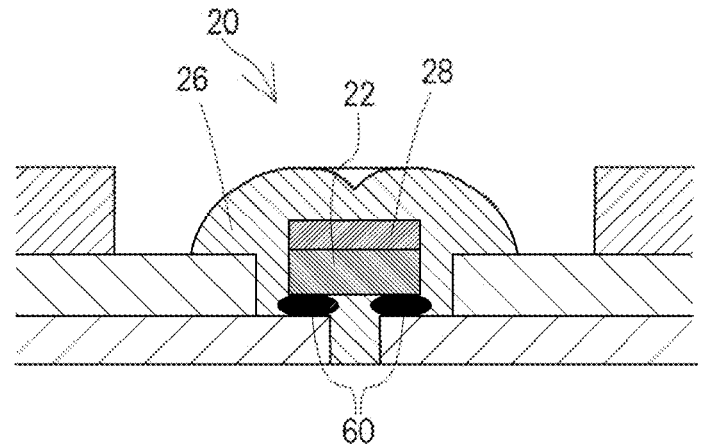

[FIG. 2B]
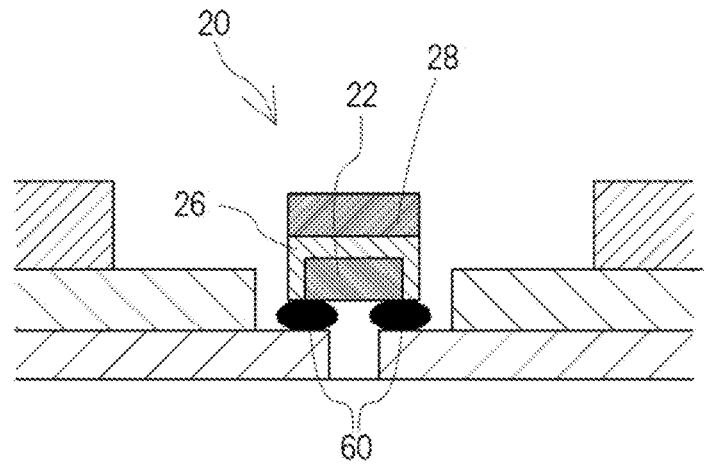
[FIG. 3]
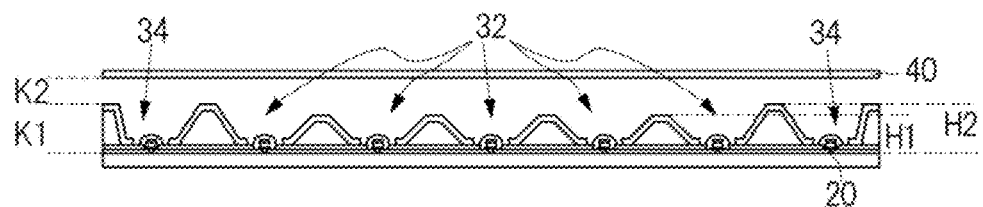
[FIG. 4A]
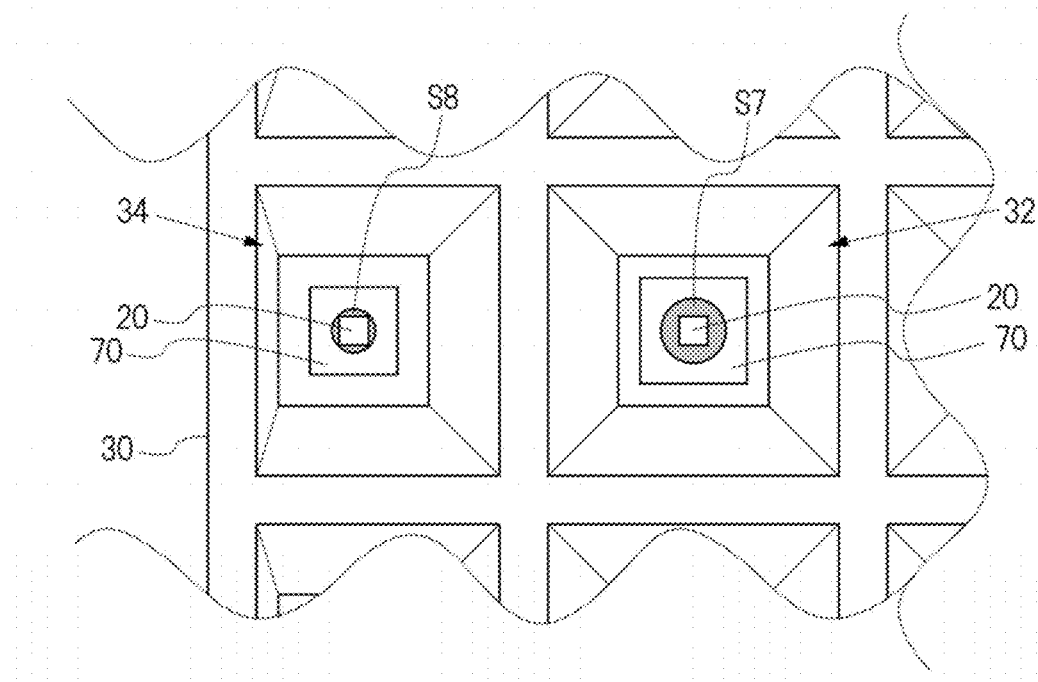

[FIG. 4B]
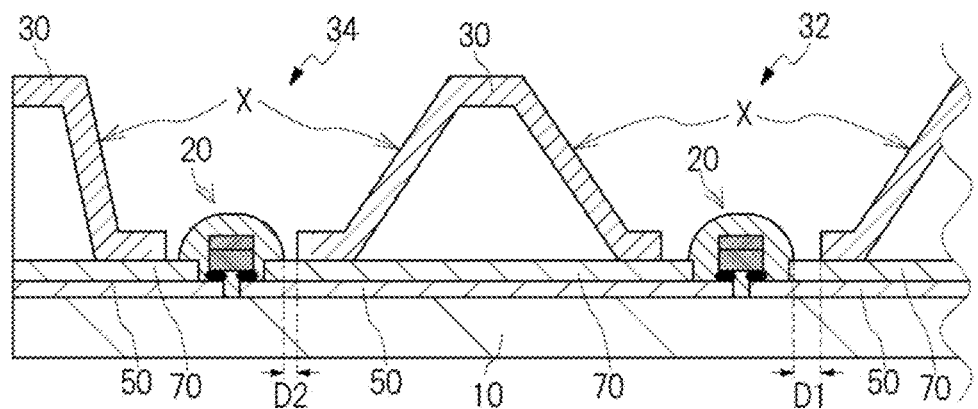
[FIG. 5A]
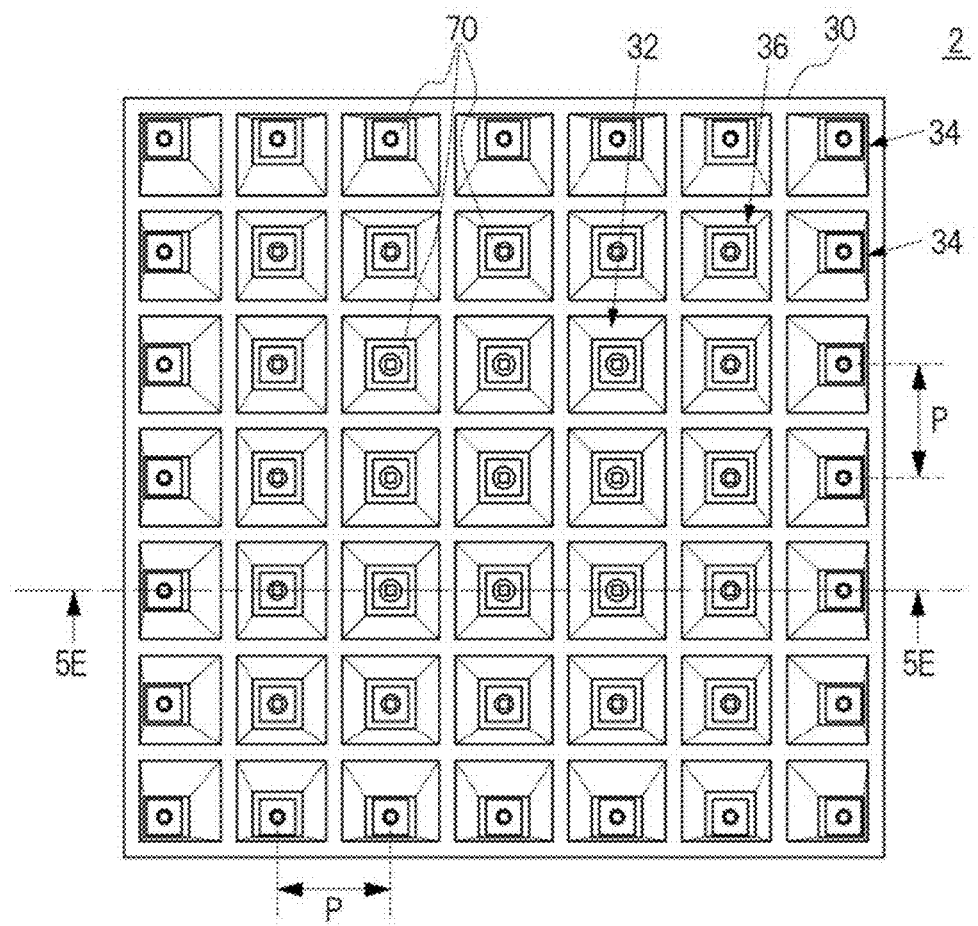

[FIG. 5B]
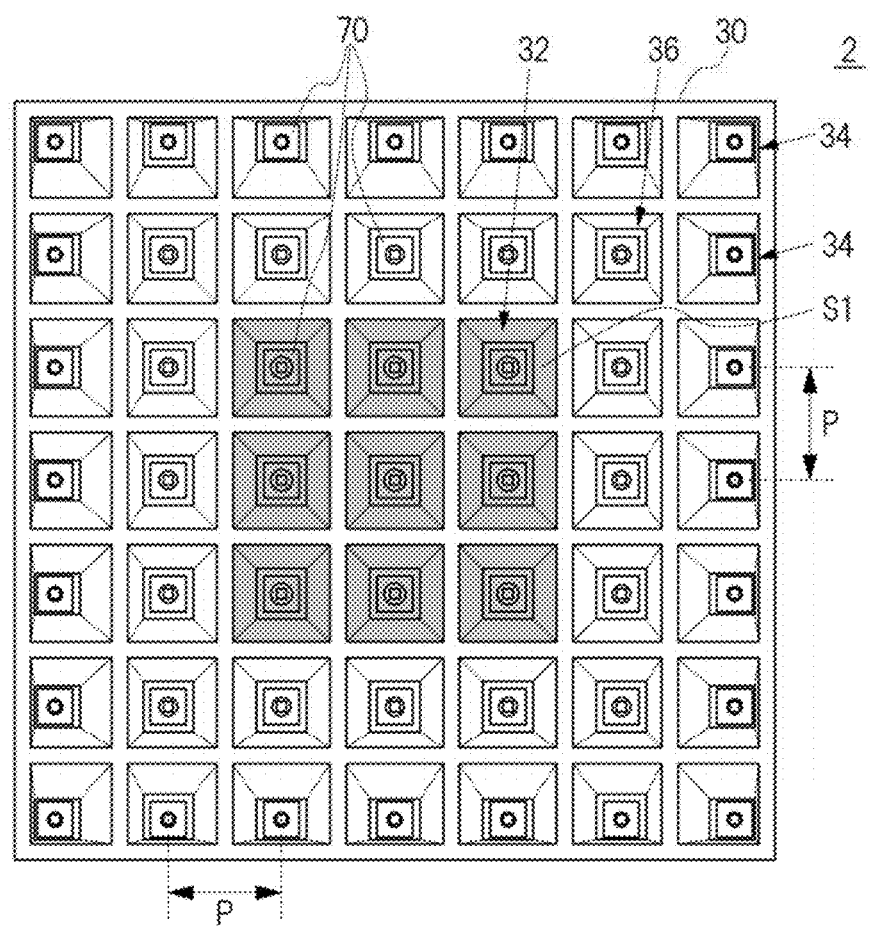

[FIG. 5C]
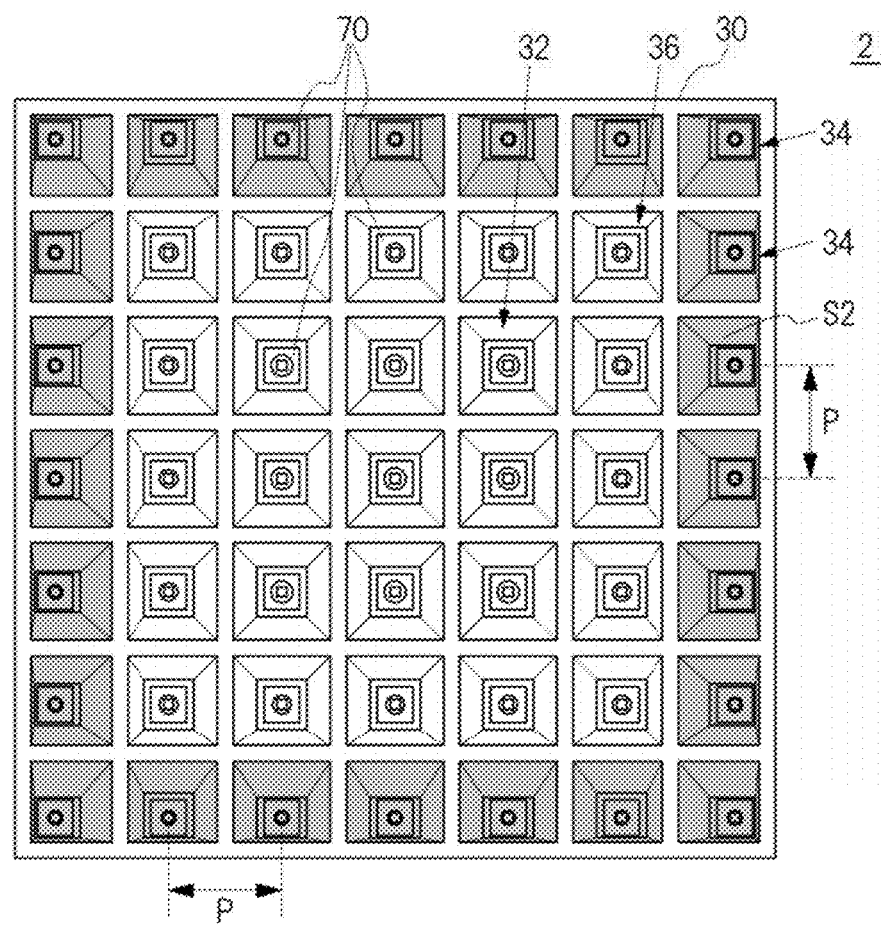

[FIG. 5D]
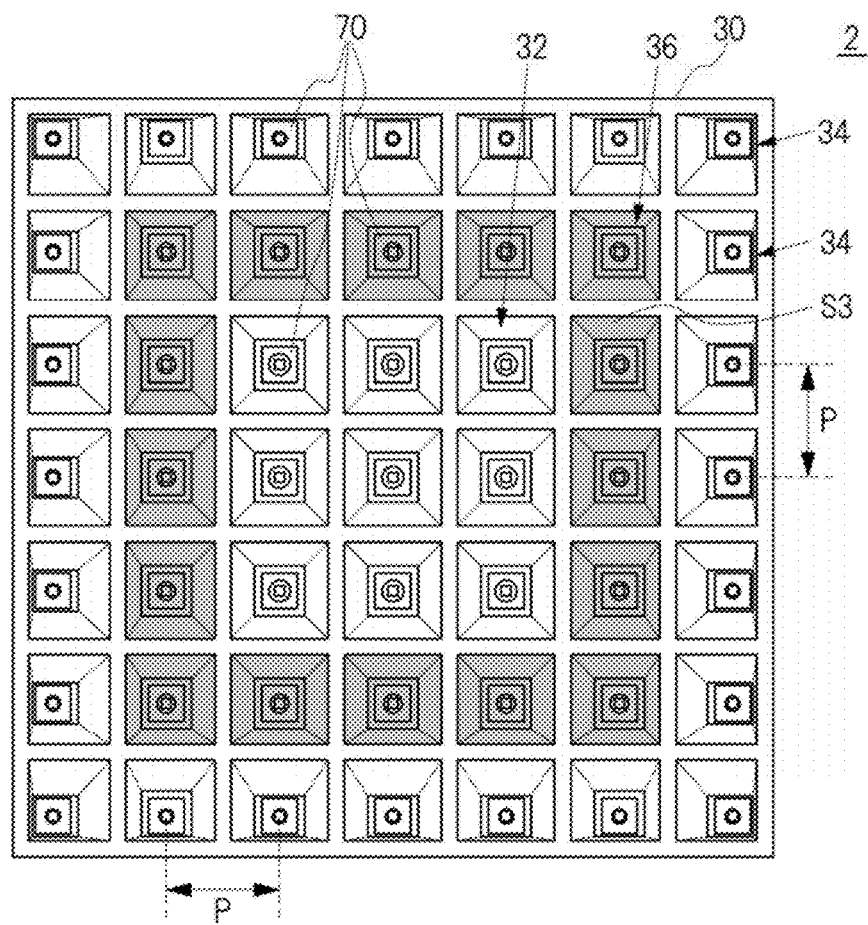
[FIG. 5E]
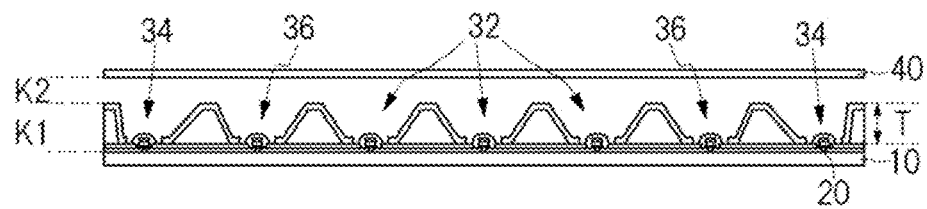

[FIG. 5F]
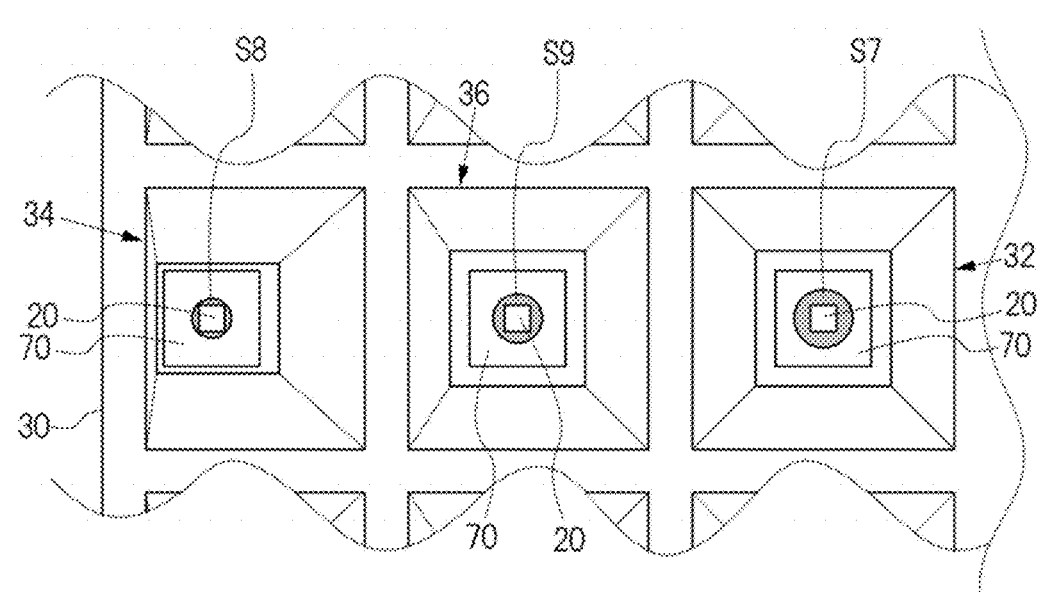

LIGHT-EMITTING DEVICE

BACKGROUND OF THE INVENTION

1. Field of the Invention

The present invention relates to a light-emitting device.

2. Description of Related Art

Light-emitting devices each including a plurality of light sources have been proposed (see WO 2012/023459).

In a conventional light-emitting device, the luminance at an outer peripheral portion of the device may be lower than the luminance at the central portion of the device. This is because light emitted from other portions of the device easily reaches the central portion of the device but does not easily reach the outer peripheral portion of the device.

SUMMARY OF THE INVENTION

The above problem can be solved by, for example, the following.

A light-emitting device includes a base member, conductor wiring disposed on an upper surface of the base member, a reflective member covering the upper surface of the base member and an upper surface of the conductor wiring and having a plurality of apertures in which part of the upper surface of the base member and part of the upper surface of the conductor wiring are located, a plurality of light sources bonded to the part of the upper surface of the conductor wiring located in the plurality of apertures with bonding members, and a reflector that is disposed on the reflective member and includes a plurality of surrounding portions, the plurality of surrounding portions respectively surrounding the plurality of light sources in a plan view, each of the plurality of surrounding portions having inclined lateral surfaces that widen in an upward direction, the plurality of surrounding portions including a plurality of first surrounding portions and a plurality of second surrounding portions surrounding the plurality of first surrounding portions, an area of an aperture in each of the plurality of second surrounding portions being smaller than an area of an aperture in each of the plurality of first surrounding portions in the plan view.

Effects of the Invention

In the light-emitting device as described above, the light density over the surrounding portions at the outer peripheral portion of the device is higher than the light density over the surrounding portions at the central portion of the device. Accordingly, the luminance at the outer peripheral portion of the device can be similar to the luminance at the central portion of the device, so that the luminance over the device can be more uniform throughout the device.

BRIEF DESCRIPTION OF THE DRAWINGS

FIG. 1A is a schematic plan view of a light-emitting device according to a first embodiment.

FIG. 1B is a diagram in which a plurality of first surrounding portions in FIG. 1A are shaded in gray.

FIG. 1C is a diagram in which a plurality of second surrounding portions in FIG. 1A are shaded in gray.

FIG. 1D is a schematic cross-sectional view taken along the line 1D-1D of FIG. 1A.

FIG. 1E is a schematic, partial, enlarged view of FIG. 1D.

FIG. 1F is a schematic, partial, enlarged view of FIG. 1E.

FIG. 2A is a schematic cross-sectional view of another example of a light source in the first embodiment.

FIG. 2B is a schematic cross-sectional view of still another example of a light source in the first embodiment.

FIG. 3 is a schematic cross-sectional view of another example of a reflector in the first embodiment.

FIG. 4A is a diagram in which apertures of a reflective member in a first surrounding portion and a second surrounding portion in a schematic, partial, enlarged view of FIG. 1A are shaded in gray.

FIG. 4B is a schematic cross-sectional view of still another example of a reflector in the first embodiment.

FIG. 5A is a schematic plan view of a light-emitting device according to a second embodiment.

FIG. 5B is a diagram in which a plurality of first surrounding portions in FIG. 5A are shaded in gray.

FIG. 5C is a diagram in which a plurality of second surrounding portions in FIG. 5A are shaded in gray.

FIG. 5D is a diagram in which a plurality of third surrounding portions in FIG. 5A are shaded in gray.

FIG. 5E is a schematic cross-sectional view taken along the line 5E-5E of FIG. 5A.

FIG. 5F is a diagram in which apertures of a reflective member in a first surrounding portion, a second surrounding portion, and a third surrounding portion in a schematic, partial, enlarged view of FIG. 5A are shaded in gray.

DETAILED DESCRIPTION OF EMBODIMENTS

Light-Emitting Device 1 According to First Embodiment

FIG. 1A is a schematic plan view of a light-emitting device according to a first embodiment. FIG. 1B is a diagram in which a plurality of first surrounding portions 32 in FIG. 1A are shaded in gray to facilitate the understanding of the locations of the first surrounding portions 32. FIG. 1C is a diagram in which a plurality of second surrounding portions 34 in FIG. 1A are shaded in gray to facilitate the understanding of the locations of the second surrounding portions 34. In FIG. 1A, FIG. 1B, and FIG. 1C, only a base member 10, a reflective member 70, light-emitting elements 22, and a reflector 30 are illustrated, and illustrations of other members such as an optical member 40 are omitted, to facilitate the understanding of the shape of the reflector 30. FIG. 1D is a schematic cross-sectional view taken along the line 1D-1D of FIG. 1A. FIG. 1E is a schematic, partial, enlarged view of FIG. 1D. FIG. 1F is a schematic, partial, enlarged view of FIG. 1E.

As shown in FIG. 1A to FIG. 1F, a light-emitting device 1 according to the first embodiment includes the base member 10, conductor wiring 50 disposed on an upper surface of the base member 10, the reflective member 70 covering the upper surface of the base member 10 and an upper surface of the conductor wiring 50 and having a plurality of apertures in which part of the upper surface of the base member 10 and part of the upper surface of the conductor wiring 50 are located, a plurality of light sources 20 bonded to the part of the upper surface of the conductor wiring 50 located in the plurality of apertures with bonding members 60, and the reflector 30 that is disposed on the reflective member 70 and includes a plurality of surrounding portions. The plurality of surrounding portions respectively surround the plurality of light sources 20 in a plan view. Each of the plurality of surrounding portions has inclined lateral surfaces X widened upward. The plurality of surrounding portions include the plurality of first surrounding portions 32 and the plurality of second surrounding portions 34 surrounding the plurality of first surrounding portions 32. An area of an aperture S8 in each of the plurality of second surrounding portions 34 is smaller than an area of an aperture S7 in each of the plurality of first surrounding portions 32 in the plan view. The details will be described below.

(Light-Emitting Device 1)

The light-emitting device 1 is, for example, a direct-lit backlight device.

(Base Member 10)

The base member 10 is a member on or above which the light sources 20 are mounted.

Examples of a material used for the base member 10 include ceramics and resins, such as phenolic resins, epoxy resins, polyimide resins, BT resins, polyphthalamide (PPA), and poly(ethylene terephthalate) (PET). Examples of the ceramics include alumina, mullite, forsterite, glass ceramics, and nitride (such as AlN) and carbide (such as SiC) ceramics, and LTCC. In the case where a resin is used as a material of the base member 10, glass fiber or an inorganic filler, such as $SiO_2$, $TiO_2$, or $Al_2O_3$, can be mixed into the resin to improve the mechanical strength, reduce the thermal expansion coefficient, and improve the light reflectance. A metal substrate in which an insulating layer is disposed on a surface of a metal member may be used as the base member 10.

A thickness of the base member 10 can be selected appropriately. The base member 10 may be, for example, a flexible substrate that can be manufactured using a roll-to-roll manner, or may be a rigid substrate. The rigid substrate may be a slim rigid substrate that is bendable.

(Conductor Wiring 50)

The conductor wiring 50 for supplying electricity to the light sources 20 (i.e., light-emitting elements 22) can be disposed at least on an upper surface of the base member 10. The conductor wiring 50 is electrically connected to electrodes of the light sources 20 (i.e., light-emitting elements 22) and is configured to supply a current (i.e., electricity) from outside.

A material of the conductor wiring 50 can be appropriately selected in accordance with a material used for the base member 10 and a method of manufacturing the base member 10. For example, in the case where a ceramic is used as a material of the base member 10, a material of the conductor wiring 50 is preferably a material having a melting point that is high enough to endure sintering temperatures of a ceramic sheet. A metal with a high melting point, such as tungsten or molybdenum, is preferable for a material of the conductor wiring 50. In addition, a member in which a surface of a metal member made of such a metal is covered with another metal material, such as nickel, gold, or silver, by plating, sputtering, vapor deposition, or the like can be used as the conductor wiring 50. In the case where a glass epoxy resin is used as a material of the base member 10, a material that is easy to process is preferably used as a material of the conductor wiring 50.

The conductor wiring 50 can be formed on one or both of opposite surfaces of the base member 10 by a method such as vapor deposition, sputtering, or plating. Metal foil attached to the base member 10 by pressing may serve as the conductor wiring 50. The conductor wiring 50 can be patterned to have a predetermined shape by forming a mask on the conductor wiring 50 by printing or photolithography and then performing etching.

(Reflective Member 70)

The reflective member 70 is an insulating member that reflects light or reduces leakage and absorption of light to increase light extraction efficiency of the light-emitting device 1. The reflective member 70 covers the upper surface of the base member 10 and the upper surface of the conductor wiring 50. For example, a member containing a white filler can be used as the reflective member 70. For the reflective member 70, any appropriate insulating material can be used, and a material that is unlikely to absorb light emitted from the light-emitting elements 22 is particularly preferable. Specific examples of the material used for the reflective member 70 include an epoxy resin, a silicone resin, a modified silicone resin, a urethane resin, an oxetane resin, an acrylic resin, a polycarbonate resin, and a polyimide resin.

The reflective member 70 has a plurality of apertures S7 and S8 in which part of the upper surface of the base member 10 and part of the upper surface of the conductor wiring 50 are located. For example, as shown in FIG. 4A and FIG. 4B, the area of the aperture S8 in each of the second surrounding portions 34 is smaller than the area of the aperture S7 in each of the first surrounding portions 32 in a plan view. With this structure, the reflective member 70 reflects more light in the second surrounding portions 34 than in the first surrounding portions 32, so that the light density over the surrounding portions at the outer peripheral portion of the light-emitting device is higher than the light density over the surrounding portions at the central portion of the device. Accordingly, a luminance at the outer peripheral portion of the device can be similar to a luminance at the central portion of the device, so that the luminance over the device can be more uniform throughout the device.

(Light Sources 20)

The plurality of light sources 20 are bonded to the part of the upper surface of the conductor wiring 50 located in the plurality of apertures S7 and S8 with the bonding members 60.

The intervals between the light sources 20, in other words, intervals P between adjacent light sources 20, are preferably uniform (including the case where the intervals P are varied to the extent that is small enough to be regarded as uniform) in the longitudinal and lateral directions in a plan view. In the present embodiment, the area of the aperture S8 in each of the second surrounding portions 34 is smaller than the aperture area S7 of each of the first surrounding portions 32. A luminance similar to the luminance at the central portion of the light-emitting device can be obtained at the outer peripheral portion of the device without comparatively complicated design changes such as changes in the arrangement of the light sources 20. Thus, designing of the light-emitting device 1 is facilitated. In addition to employing different sizes of the aperture areas S7 and S8 of the reflective member 70, by employing the first surrounding portions 32 that differ in size from the second surrounding portions 34 of the reflector 30, such as by allowing an upper aperture area S2 defined by the upper ends of the inclined lateral surfaces X of each of the second surrounding portions 34 to be smaller than an upper aperture area S1 defined by the upper ends of the inclined lateral surfaces X of each of the first surrounding portions 32, a luminance similar to the luminance at the central portion of the device is more easily obtained at the outer peripheral portion of the device. Thus, the need for changes in the arrangement of the light sources 20 is further reduced, and design flexibility of the light-emitting device 1 can be more easily ensured.

Each light source 20 may include the light-emitting element 22 such as a light-emitting diode. The light-emitting element 22 includes, for example, a light-transmissive substrate and a semiconductor layer layered on the substrate. For example, sapphire can be used for the light-transmissive substrate. The semiconductor layer includes, for example, an n-type semiconductor layer, an active layer, and a p-type semiconductor layer in this order from the substrate. For example, ZnSe, a nitride semiconductor ($In_xAl_yGa_{1-x-y}N$, where $0 \leq X$, $0 \leq Y$, and $X+Y \leq 1$), GaP, GaAlAs, or AlInGaP can be used for the semiconductor layer. For example, an n-side electrode is formed on the n-type semiconductor layer, and a p-side electrode is formed on the p-type semiconductor layer.

Each light source 20 may include a sealing member 26. The sealing member 26 protects the light-emitting element 22 against external environments and optically controls light that exits from the light-emitting element 22. The sealing member 26 is disposed on or above the base member 10 to cover the light-emitting element 22. An end portion of each of the apertures S7 and S8 of the reflective member 70, the end portion facing the light source, may be located inside or outside the sealing member 26 in a plan view. In the case where the end portion facing the light source is located inside the sealing member 26, each of the apertures S7 and S8 is covered with the sealing member 26. In the case where the end portion facing the light source is located outside the sealing member 26, the sealing member 26 is disposed inside each of the apertures S7 and S8.

Examples of the material used for the sealing member 26 include an epoxy resin, a silicone resin, a mixture of these resins, and a light-transmissive material such as glass. Among these materials, a silicone resin is preferably selected in consideration of light resistance and ease of molding. The sealing member 26 can contain a light-diffusing agent, a wavelength conversion member, such as a phosphor, that absorbs light emitted from the light-emitting element 22 to emit light with a wavelength different from the wavelength of the light emitted from the light-emitting element 22, and a coloring agent corresponding to the emission color of the light-emitting element 22.

The sealing member 26 can be formed by, for example, molding such as compression molding or injection molding, dropping, or drawing. Alternatively, by optimizing the viscosity of a material of the sealing member 26, the shape of the sealing member 26 can be controlled due to surface tension of the material of the sealing member 26. In the case of dropping or drawing, the sealing member 26 can be formed in a simpler manner without using molds. Adjustment of the viscosity may be achieved by employing a material having a desired viscosity as a material of the sealing member 26, or by using the above-described light-diffusing agent, wavelength conversion member, or coloring agent.

Each light source 20 preferably has a batwing light distribution characteristic. In such a light distribution characteristic, the amount of light emitted directly upward from each light source 20 can be reduced, and a broad light distribution of the light source 20 can be achieved. Accordingly, the thickness of the light-emitting device 1 can be reduced, particularly in the case where the light-transmissive optical member 40 is disposed to face the base member 10. Thus, a light-emitting device with a small thickness can be provided while allowing the luminance at the outer peripheral portion of the device to be the same as the luminance at the central portion of the device.

The expression "batwing light distribution characteristic" refers to such a light distribution characteristic that the luminance at the central portion is lower than the luminance at the outer peripheral portion. Examples of the batwing light distribution characteristic include, with an optical axis L being 0 degrees, a light distribution characteristic having an emission intensity distribution in which the emission intensity at angles with absolute values larger than 0 degrees is high and a light distribution characteristic having an emission intensity distribution in which the emission intensity is the highest in a range of approximately 45 degrees to 90 degrees.

Each light source 20 may include a reflective layer 28 on the upper surface of the light-emitting element 22. In this case, the sealing member 26 can cover, for example, the light-emitting element 22 and the reflective layer 28. With the sealing member 26 disposed in this manner, forming the sealing member 26 into a shape such as a shape described below shown in FIG. 2A easily provides the batwing light distribution characteristic.

FIG. 2A is a schematic cross-sectional view of another example of a light source in the first embodiment. A sealing member 26 may have, for example, a domical shape or, as shown in FIG. 2A, a shape that broadens the distribution of light emitted from the light-emitting element 22, more specifically, a shape having a depressed portion directly above the light-emitting element. With this structure, the sealing member 26 functions as a lens to broaden the light distribution, and the batwing light distribution characteristic can be obtained without the reflective layer 28 as described above. Alternatively, the combination of the reflective layer 28 and the sealing member 26 that functions as a lens can more easily provide the batwing light distribution characteristic.

FIG. 2B is a schematic cross-sectional view of still another example of a light source in the first embodiment. Each light source 20 may include a reflective layer 28 over a sealing member 26 as shown in FIG. 2B. With this structure, the reflective layer 28 reflects light emitted upward from the light-emitting element 22, so that the amount of light emitted directly upward from the light-emitting element 22 is reduced. Accordingly, the batwing light distribution characteristic can be easily achieved.

The reflective layer 28 may be a metal film or a dielectric multilayer film.

It is preferable that the light sources 20 can be driven separately from one another. It is particularly preferable that light control (such as local dimming and high dynamic range: HDR) can be performed with respect to each of the light sources 20.

(Reflector 30)

The reflector 30 reflects light emitted from the light sources 20. The reflector 30 preferably has an average reflectance of 70% or more of light emitted from the light sources 20 in a wavelength range of 440 nm to 630 nm. For example, a resin member containing a reflective material made of particles of a metal oxide such as titanium oxide, aluminum oxide, or silicon oxide, or a member in which a reflective member is disposed on a surface of a resin member containing no reflective material can be used for the reflector 30.

The reflector 30 is disposed on the reflective member 70 and includes a plurality of surrounding portions, which respectively surround the plurality of light sources 20 in a plan view. A single surrounding portion surrounds a single light source. The plurality of surrounding portions include the first surrounding portions 32 and the second surrounding portions 34 surrounding the first surrounding portions 32. Each of the plurality of surrounding portions has the inclined lateral surfaces X widened upward. The upper aperture area S2 defined by the upper ends of the inclined lateral surfaces X of each of the second surrounding portions 34 is preferably smaller than the upper aperture area S1 defined by the upper ends of the inclined lateral surfaces X of each of the first surrounding portions 32. This structure allows the light density over the second surrounding portions 34 to be even higher than the light density over the first surrounding portions 32; in other words, this structure allows the light density at the outer peripheral portion of the light-emitting device to be higher than the light density over the central portion of the device. A luminance similar to the luminance at the central portion of the device is thus more easily obtained at the outer peripheral portion of the device. The "light density" refers to the degree of intensity of light per unit area.

The reflector 30 has a thickness T in a range of, for example, 100 µm to 300 µm.

The plurality of surrounding portions of the reflector 30 each preferably have a planar portion extending from the lower ends of the inclined lateral surfaces X toward the light source 20. In FIG. 1E, the inclination angle of each of the inclined lateral surfaces X of the second surrounding portions 34 is larger than the inclination angle of each of the inclined lateral surfaces X of the first surrounding portions 32.

A distance D2 between an end portion of the planar portion of the second surrounding portions 34, the end portion facing a corresponding one of the light sources, and an end portion of the corresponding light source is preferably smaller than a distance D1 between an end portion of the planar portion of the first surrounding portions 32, the end portion facing a corresponding one of the light sources, and an end portion of the corresponding light source as shown in, for example, FIG. 4B. This structure allows the light density over the second surrounding portions 34 to be even higher than the light density over the first surrounding portions 32, so that the light density over the surrounding portions at the outer peripheral portion of the light-emitting device is higher than the light density over the surrounding portions at the central portion of the device. Thus, a luminance similar to the luminance at the central portion of the device is more easily obtained at the outer peripheral portion of the device.

FIG. 3 is a schematic cross-sectional view of another example of a reflector in the first embodiment. A height H2 between the upper surface of the base member 10 and the upper end of each of the inclined lateral surfaces X of the second surrounding portions 34 is preferably greater than a height H1 between the upper surface of the base member 10 and the upper end of each of the inclined lateral surfaces X of the first surrounding portions 32 as shown in FIG. 3. This structure increases the amount of light that is multiple-reflected within the second surrounding portions 34, which further increases the light density over the second surrounding portions 34, so that the luminance at the outer peripheral portion of the light-emitting device can be increased.

(Optical Member 40)

The optical member 40 faces the base member 10 across a plurality of light sources 20. A distance K2 between the upper end of each of the inclined lateral surfaces X and the optical member 40 is preferably equal to or less than a half of a distance K1 between the upper surface of the base member 10 and the upper end of each of the inclined lateral surfaces X. This structure allows a depth of each of the first surrounding portions 32 and the second surrounding portions 34 to be relatively great in proportion to the distance between the reflector 30 and the optical member 40, so that the number of repetitions of multiple reflection of light within the first surrounding portions 32 and the second surrounding portions 34 can be increased. Accordingly, the density of light from each surrounding portion at the location of the optical member 40 can be enhanced.

For example, a light-transmissive member such as a semitransparent mirror can be used for the optical member 40. For the semitransparent mirror, for example, a material that reflects a part of incident light and transmits another part of the light can be used.

The semitransparent mirror preferably has a reflectance with respect to light incident in an oblique direction lower than a reflectance thereof with respect to light incident in a perpendicular direction. That is, the semitransparent mirror preferably has a property in which a reflectance of the semitransparent mirror with respect to light emitted from each light source 20 parallel to the optical axis direction is high and a light reflectance decreases in accordance with increase in the radiation angle (in other words, the property in which the amount of light transmitted through the semitransparent mirror increases). Light parallel to the optical axis direction is regarded to have a radiation angle of 0 degrees. This structure can easily provide a uniform luminance distribution when the semitransparent mirror is observed from the emission surface.

For example, a dielectric multilayer film can be used for the semitransparent mirror. By using a dielectric multilayer film, a reflective film with low light absorption can be obtained. Further, the reflectance can be adjusted as desired by changing the design of the film, and the reflectance with respect to an angle of emitted light can be controlled. For example, with the dielectric multilayer film designed to have a reflectance with respect to light incident in an oblique direction on the semitransparent mirror lower than a reflectance thereof with respect to light incident perpendicularly on the semitransparent mirror, a property can be easily realized in which a reflectance with respect to light incident perpendicularly on the light-extracting surface is higher and a reflectance decreases in accordance with increase in the angle of incident light with respect to the light-extracting surface.

The light-emitting device 1 may include a light diffusing plate at the emission surface of the optical member 40. The light diffusing plate diffuses light emitted from a plurality of light sources 20 to reduce unevenness in luminance. For the light diffusing plate, a material that is unlikely to absorb visible light, such as a polycarbonate resin, a polystyrene resin, an acrylic resin, or a polyethylene resin can be used. For example, a member that contains a base material and a material having a refractive index different from the refractive index of the base material, or a member made of a base material and having a surface that is processed so as to scatter light can be used for the light diffusing plate.

(Bonding Members 60)

The light-emitting device 1 includes the bonding members 60. The bonding members 60 fix the light sources 20 to the base member 10 and/or the conductor wiring 50. Examples of the bonding members 60 include insulating resins and electrically-conductive members. In the case where the light sources 20 are flip-chip mounted, electrically-conductive members can be used for the bonding members 60. Examples of the bonding members 60 include Au-containing alloys, Ag-containing alloys, Pd-containing alloys, In-containing alloys, Pb—Pd-containing alloys, Au—Ga-containing alloys, Au—Sn-containing alloys, Sn-containing alloys, Sn—Cu-containing alloys, Sn—Cu—Ag-containing alloys, Au—Ge-containing alloys, Au—Si-containing alloys, Al-containing alloys, Cu—In-containing alloys, and mixtures of metals and fluxes.

For example, a member in a form of liquid, paste, or solid (sheet-shaped, block-shaped, powdered, or wire-shaped) may be used singly or in combination for the bonding members 60. Appropriate materials can be selected in accordance with the shape of the base member 10 and the composition. In the case where electrically connecting the light sources 20 to the conductor wiring 50 and mounting or fixing the light sources 20 above or to the base member 10 are not performed at once but are performed separately, wires other than the bonding members 60 may be used to electrically connect the light sources to the conductor wiring 50.

As described above, in the light-emitting device 1 according to the first embodiment, the area of the aperture S8 in each of the second surrounding portions 34 is smaller than the area of the aperture S7 in each of the first surrounding portions 32 in a plan view. Thus, the reflective member 70 reflects more light in the second surrounding portions 34 than in the first surrounding portions 32, so that the light density over the surrounding portions at the outer peripheral portion of the device is higher than the light density over the surrounding portions at the central portion of the device. Accordingly, a luminance at the outer peripheral portion of the device can be similar to a luminance at the central portion of the device, so that the luminance over the device can be more uniform throughout the device.

Light-Emitting Device 2 According to Second Embodiment

FIG. 5A is a schematic plan view of a light-emitting device according to a second embodiment. FIG. 5B is a diagram in which the plurality of first surrounding portions 32 in FIG. 5A are shaded in gray to facilitate the understanding of the locations of the first surrounding portions 32. FIG. 5C is a diagram in which the plurality of second surrounding portions 34 in FIG. 5A are shaded in gray to facilitate the understanding of the locations of the second surrounding portions 34. FIG. 5D is a diagram in which a plurality of third surrounding portions 36 in FIG. 5A are shaded in gray to facilitate the understanding of the locations of the third surrounding portions 36. FIG. 5E is a schematic cross-sectional view taken along the line 5E-5E of FIG. 5A. FIG. 5F is a diagram in which apertures of a reflective member in a first surrounding portion, a second surrounding portion, and a third surrounding portion in a schematic, partial, enlarged view of FIG. 5A are shaded in gray.

As shown in FIG. 5A to FIG. 5F, a light-emitting device 2 according to the second embodiment differs from the light-emitting device 1 according to the first embodiment in that the plurality of surrounding portions include the third surrounding portions 36 between the first surrounding portions 32 and the second surrounding portions 34, and in that the area of an aperture S9 in each of the third surrounding portions 36 is smaller than the area of the aperture S7 in each of the first surrounding portions 32 and larger than the area of the aperture S8 in each of the second surrounding portions 34 in a plan view. In the light-emitting device 2 according to the second embodiment, the relation the light density over the second surrounding portions 34>the light density over the third surrounding portions 36>the light density over the first surrounding portions 32 is satisfied, and the light density over the device gradually increases from the central portion toward the outer peripheral portion of the device. Accordingly, the luminance at the outer peripheral portion of the device can be similar to the luminance at the central portion of the device, so that the luminance over the device can be more uniform throughout the device. It is preferable that an upper aperture area S3 defined by the upper ends of the inclined lateral surfaces X of each of the third surrounding portions 36 be smaller than the upper aperture area S1 in each of the first surrounding portions 32 and larger than the upper aperture area S2 in each of the second surrounding portions 34. This structure further facilitates establishment of the relation between the light densities described above. Thus, a luminance similar to the luminance at the central portion of the device can be obtained at the outer peripheral portion of the device, so that the luminance over the device can be even more uniform throughout the device.

Certain embodiments of the present invention have been described above, but descriptions thereof do not limit the scope of in the claims.

The invention claimed is:
1. A light-emitting device comprising:
a base member;
conductor wiring disposed on an upper surface of the base member;
a reflective member covering the upper surface of the base member and an upper surface of the conductor wiring and having a plurality of apertures in which part of the upper surface of the base member and part of the upper surface of the conductor wiring are located;
a plurality of light sources bonded to the part of the upper surface of the conductor wiring located in the plurality of apertures, respectively, with bonding members; and
a reflector disposed on the reflective member and comprising a plurality of surrounding portions, the plurality of surrounding portions respectively surrounding the plurality of light sources and the respective apertures in a plan view, each of the plurality of surrounding portions having inclined lateral surfaces that widen in an upward direction,
wherein the plurality of surrounding portions comprise a plurality of first surrounding portions and a plurality of second surrounding portions surrounding the plurality of first surrounding portions, and
wherein an area of the respective aperture in each of the plurality of second surrounding portions is smaller than an area of the respective aperture in each of the plurality of first surrounding portions in the plan view.

2. The light-emitting device according to claim 1, wherein intervals between adjacent ones of the plurality of light sources are substantially uniform in the plan view.

3. The light-emitting device according to claim 1, wherein an upper aperture area defined by upper ends of the inclined lateral surfaces of each of the second surrounding portions is smaller than an upper aperture area defined by upper ends of the inclined lateral surfaces of each of the first surrounding portions.

4. The light-emitting device according to claim 2, wherein an upper aperture area defined by upper ends of the inclined lateral surfaces of each of the second surrounding portions is smaller than an upper aperture area defined by upper ends of the inclined lateral surfaces of each of the first surrounding portions.

5. The light-emitting device according to any one of claim 1, wherein the plurality of surrounding portions further comprise a plurality of third surrounding portions between the first surrounding portions and the second surrounding portions, and wherein an area of an aperture in each of the third surrounding portions is smaller than the area of the aperture in each of the first surrounding portions and larger than the area of the aperture in each of the second surrounding portions in the plan view.

6. The light-emitting device according to any one of claim 1, wherein each of the light sources has a batwing light distribution characteristic.

7. The light-emitting device according to any one of claim 1, wherein each of the light sources comprises:
a light-emitting element; and
a lens adapted to broaden a distribution of light emitted from the light-emitting element.

8. The light-emitting device according to any one of claim 1, wherein each of the light sources comprises:
a light-emitting element;
a sealing member covering the light-emitting element; and
a reflective layer on or above the sealing member.

9. The light-emitting device according to any one of claim 2, wherein each of the light sources comprises:
a light-emitting element;
a sealing member covering the light-emitting element; and
a reflective layer on or above the sealing member.

10. The light-emitting device according to any one of claim 1, wherein each of the light sources comprises:
a light-emitting element;
a reflective layer on an upper surface of the light-emitting element; and
a sealing member covering the light-emitting element and the reflective layer.

11. The light-emitting device according to any one of claim 2, wherein each of the light sources comprises:
a light-emitting element;
a reflective layer on an upper surface of the light-emitting element; and
a sealing member covering the light-emitting element and the reflective layer.

12. The light-emitting device according to claim 10, wherein an end portion of each of the apertures is located outside the corresponding sealing member in the plan view, the end portion facing a corresponding one of the light sources.

13. The light-emitting device according to claim 11, wherein an end portion of each of the apertures is located outside the corresponding sealing member in the plan view, the end portion facing a corresponding one of the light sources.

14. The light-emitting device according to any one of claim 1, the light-emitting device further comprising a light-transmissive optical member facing the base member across the plurality of light sources,
wherein a distance between an upper end of each of the inclined lateral surfaces and the optical member is equal to or less than a half of a distance between the upper surface of the base member and the upper end of the inclined lateral surface.

15. The light-emitting device according to claim 14, wherein the optical member comprises a semitransparent mirror made of a dielectric multilayer film, the semitransparent mirror being adapted to reflect a part of incident light and to transmit another part of the incident light.

16. The light-emitting device according to any one of claim 1,
wherein the reflector comprises planar portions each extending from a lower end of each of the inclined lateral surfaces toward a corresponding one of the light sources, and
wherein a distance between an end portion of the planar portion of each of the second surrounding portions, the end portion facing a corresponding one of the light sources, and an end portion of the corresponding light source is smaller than a distance between an end portion of the planar portion of each of the first surrounding portions, the end portion facing a corresponding one of the light sources, and an end portion of the corresponding light source.

17. The light-emitting device according to any one of claim 2,
wherein the reflector comprises planar portions each extending from a lower end of each of the inclined lateral surfaces toward a corresponding one of the light sources, and
wherein a distance between an end portion of the planar portion of each of the second surrounding portions, the end portion facing a corresponding one of the light sources, and an end portion of the corresponding light source is smaller than a distance between an end portion of the planar portion of each of the first surrounding portions, the end portion facing a corresponding one of the light sources, and an end portion of the corresponding light source.

18. The light-emitting device according to any one of claim 4,
wherein the reflector comprises planar portions each extending from a lower end of each of the inclined lateral surfaces toward a corresponding one of the light sources, and
wherein a distance between an end portion of the planar portion of each of the second surrounding portions, the end portion facing a corresponding one of the light sources, and an end portion of the corresponding light source is smaller than a distance between an end portion of the planar portion of each of the first surrounding portions, the end portion facing a corresponding one of the light sources, and an end portion of the corresponding light source.

19. The light-emitting device according to any one of claim 1, wherein a height between the upper surface of the base member and an upper end of each of the inclined lateral surfaces of the second surrounding portions is greater than a height between the upper surface of the base member and an upper end of each of the inclined lateral surfaces of the first surrounding portions.

20. The light-emitting device according to any one of claim 2, wherein a height between the upper surface of the base member and an upper end of each of the inclined lateral surfaces of the second surrounding portions is greater than a height between the upper surface of the base member and an upper end of each of the inclined lateral surfaces of the first surrounding portions.

* * * * *